US010386788B2

(12) United States Patent
Gill et al.

(10) Patent No.: US 10,386,788 B2
(45) Date of Patent: Aug. 20, 2019

(54) SYSTEMS AND METHODS FOR IMPROVING RESOLUTION IN LENSLESS IMAGING

(71) Applicant: Rambus Inc., Sunnyvale, CA (US)

(72) Inventors: Patrick R. Gill, Sunnyvale, CA (US); David G. Stork, Portola Valley, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 245 days.

(21) Appl. No.: 15/342,329

(22) Filed: Nov. 3, 2016

(65) Prior Publication Data

US 2017/0153599 A1    Jun. 1, 2017

Related U.S. Application Data

(60) Provisional application No. 62/261,034, filed on Nov. 30, 2015.

(51) Int. Cl.
*G03H 1/04* (2006.01)
*H04N 5/369* (2011.01)
(Continued)

(52) U.S. Cl.
CPC ........... *G03H 1/041* (2013.01); *G03H 1/0005* (2013.01); *G03H 1/0443* (2013.01); *H01L 27/14625* (2013.01); *H01L 27/14629* (2013.01); *H01L 27/14649* (2013.01); *H04N 5/2251* (2013.01); *H04N 5/23229* (2013.01); *H04N 5/33* (2013.01); *H04N 5/3696* (2013.01); *G03H 2001/0088* (2013.01); *G03H 2001/0428* (2013.01); *G03H 2001/0436* (2013.01); *G03H 2001/0441* (2013.01); *G03H 2001/0452* (2013.01); *G03H 2223/13* (2013.01)

(58) Field of Classification Search
CPC ..... G03H 1/041; G03H 1/0005; G03H 1/0443
See application file for complete search history.

(56) References Cited

U.S. PATENT DOCUMENTS 5,812,629 A * 9/1998 Clauser .................. A61B 6/032
378/37
6,781,701 B1 * 8/2004 Sweetser ............ G01M 11/0292
356/515
(Continued)

OTHER PUBLICATIONS

Garcia-Martinez et al., "Generation of Bessel Beam Arrays Through Dammann Gratings", Mar. 20, 2012, vol. 51, No. 9, Applied Optics. pp. 1375-1381. 7 Pages.
(Continued)

*Primary Examiner* — Hugh Maupin
(74) *Attorney, Agent, or Firm* — Silicon Edge Law Group LLP; Arthur J. Behiel

(57) ABSTRACT

An infrared imaging system includes a phase grating overlying a two-dimensional array of thermally sensitive pixels. The phase grating comprises a two-dimensional array of identical subgratings that define a system of Cartesian coordinates. The subgrating and pixel arrays are sized and oriented such that the pixels are evenly distributed with respect to the row and column intersections of the subgratings. The location of each pixel thus maps to a unique location beneath a virtual archetypical subgrating.

10 Claims, 12 Drawing Sheets

(51) Int. Cl.
  *G03H 1/00* (2006.01)
  *H01L 27/146* (2006.01)
  *H04N 5/225* (2006.01)
  *H04N 5/232* (2006.01)
  *H04N 5/33* (2006.01)

(56) References Cited

U.S. PATENT DOCUMENTS

| | | |
|---|---|---|
| 7,714,368 B2 | 5/2010 | Yang et al. |
| 8,111,461 B2 | 2/2012 | Guering et al. |
| 2015/0234221 A1* | 8/2015 | Anderson ........... G02F 1/13363 349/113 |

OTHER PUBLICATIONS

Guerineau et al., "Generation of Achromatic and Propagation-Invariant Spot Arrays by Use of Continuously Self-Imaging Gratings," Apr. 1, 2001, vol. 26, No. 7, Optics Letters. pp. 411-413. 3 Pages.

* cited by examiner

SYSTEMS AND METHODS FOR IMPROVING RESOLUTION IN LENSLESS IMAGING

BACKGROUND

The materials used in the manufacture of IR lenses (e.g., monocrystalline Germanium) are generally expensive relative to those for visible light, and the cost of IR lenses tends to scale with the cube of their linear size. As a result, IR imaging devices tend to be cost prohibitive.

BRIEF DESCRIPTION OF THE DRAWINGS

The detailed description is illustrated by way of example, and not by way of limitation, in the figures of the accompanying drawings and in which like reference numerals refer to similar elements and in which:

FIGS. 6C and 6D.

DETAILED DESCRIPTION

Figure 1:
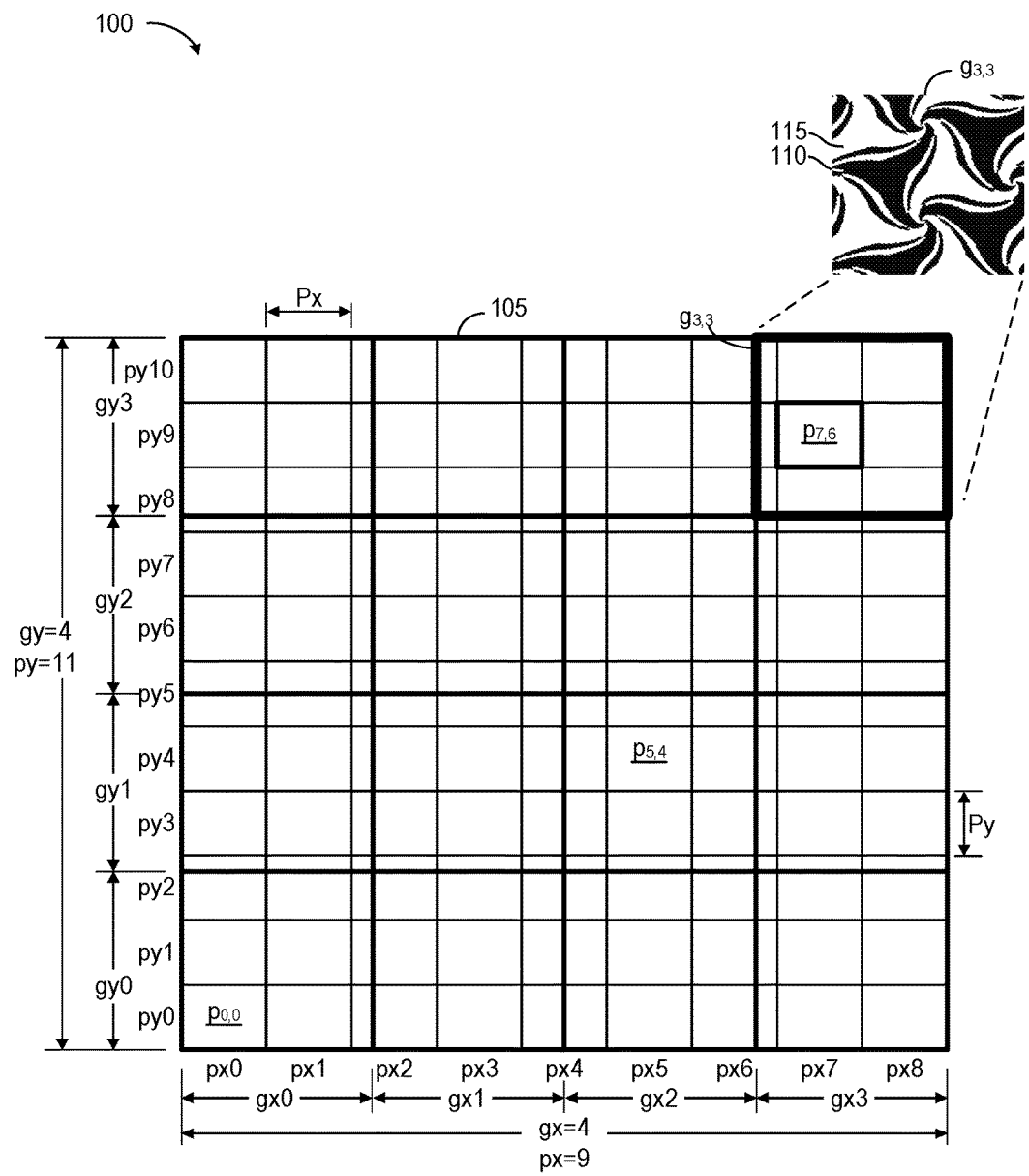
FIG. 1 depicts an infrared (IR) imaging device 100 that employs a phase grating in lieu of a lens to dramatically reduce size and cost.

FIG. 1 depicts an infrared (IR) imaging device 100 that employs a phase grating in lieu of a lens to dramatically reduce size and cost. Viewed from a perspective normal to the active surface, device 100 includes a phase grating layer 105 disposed over an array of pixels $p_{i,j}$, where i and j refer to locations along the respective X and Y axes. Grating layer 105 includes a repeating pattern of subgratings $g_{i,j}$, of which only subgrating $g_{3,3}$ is shown in detail; the remaining subgratings $g_{i,j}$ are identical in this example, and are highlighted using bold boundaries to show their placement, orientation, and size relative to underlying pixels $p_{i,j}$.

Phase gratings of the type used for subgratings $g_{i,j}$ are detailed in U.S. patent application Ser. No. 14/677,878 to Stork et al, which is incorporated herein by this reference. Briefly, and in connection with subgrating $g_{3,3}$, subgratings $g_{i,j}$ are of a material that is transparent to IR light. The surface of subgratings $g_{i,j}$ includes transparent features 110 (black) and 115 (white) that define between them boundaries of odd symmetry. Features 110 are raised in the Z dimension (normal to the view) relative to features 115, and are shown in black to elucidate this topography. As detailed below, the boundaries between features 110 and 115 produce an interference pattern on the underlying pixel array that contains rich spatial information about an imaged scene.

Subgratings $g_{i,j}$ are arranged in a two-dimensional array with a number gx along the X axis and a number gy along the Y axis. Both gx and gy are four in this simple example, but either or both numbers can be the same or different. The array of pixels $p_{i,j}$ includes a number px along the X axis and a number py along the Y axis. Numbers px and py are nine and eleven, respectively, but either or both can be different.

Features 110 and 115 within each subgrating $g_{i,j}$ form asymmetrically shaped elements with curved boundaries. Such shapes can be described mathematically by starting with identical, evenly spaced elements that approximate the desired shapes. The x/y locations of the points making up these elements are then translated by an amount that depends on x and y, where this translation is smooth. In this example, these distortions are constrained to the spaces between the edges of the subgratings such that the edges match between subgratings. The boundaries of odd symmetry are thus contiguous between subgratings (see e.g. FIG. 2).

Pixel count px is coprime with the subgrating count gx along the X axis; that is, numbers px and gx share no common integer factor other than one. Likewise, the pixel count py is coprime with the subgrating count gy along the Y axis. With this arrangement, imaging device 100 obtains px times py independent samples of the interference pattern created by a single instance of a subgrating $g_{i,j}$. The effective pixel pitch is 1/gy times pixel pitch Py in the Y dimension and 1/px times the pixel pitch Px in the X dimension. Unless otherwise specified, the X and Y dimensions refer to the Cartesian coordinate system defined by the array of subgratings.

Pixel arrays for IR cameras, also called "thermographic" or "thermal-imaging" cameras, can be cooled to support certain types of IR sensitive semiconductors. Cooling adds complexity, cost, and requires power. The pixels in uncooled detectors are mostly based on pyroelectric and ferroelectric materials or microbolometer technology. Uncooled sensors offer inferior image quality, but are substantially simpler, smaller, and less expensive.

Though not shown, pixel arrays can include superfluous pixel structures that are e.g. defective or redundant and not used for image capture. Such superfluous structures are not "pixels" as that term is used herein, as that term refers to elements that provide a measurement of illumination that is used for image acquisition. Redundant pixels can be used to take multiple measurements of pixels in equivalent positions, reducing noise.

Figure 2:
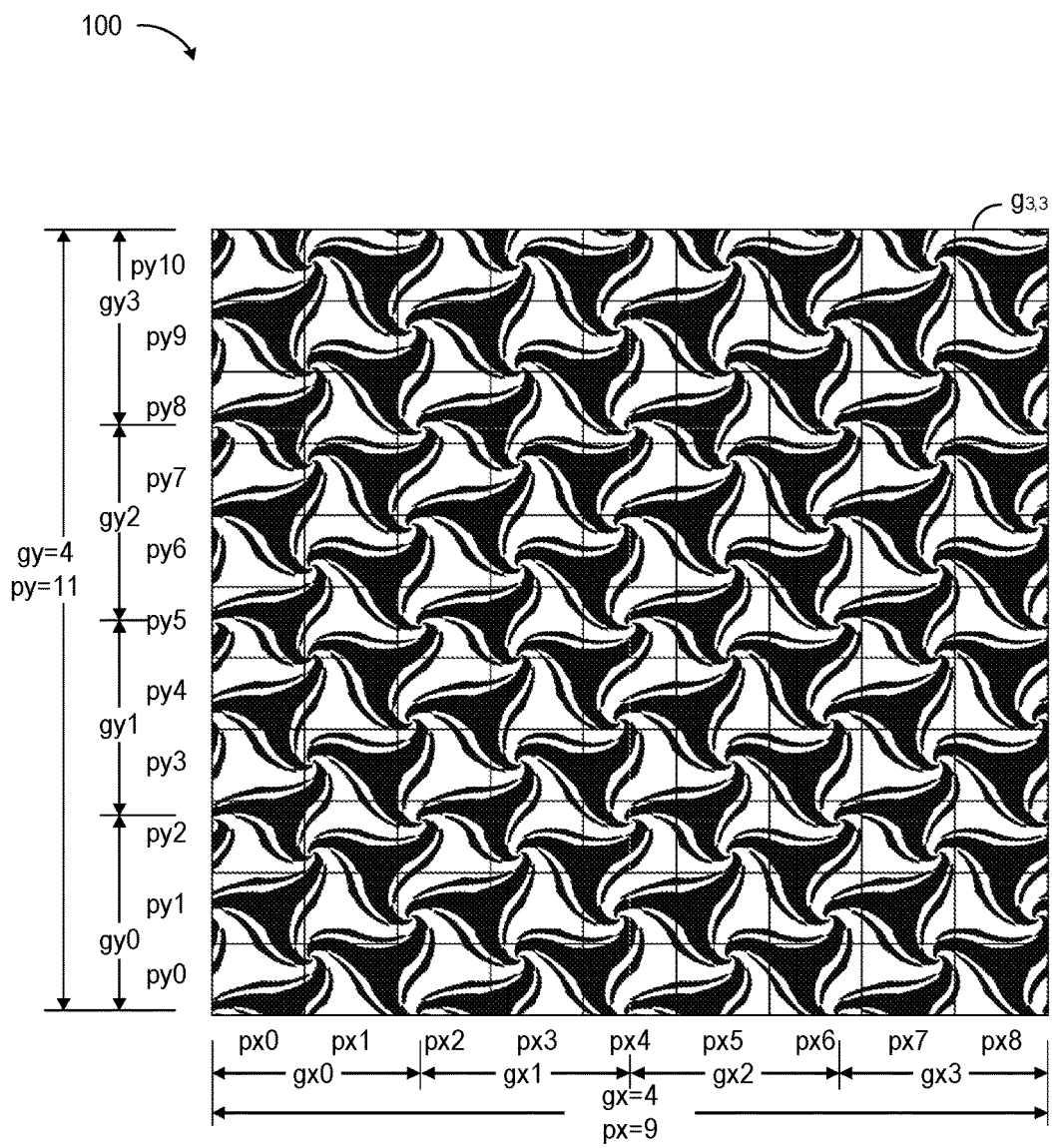
FIG. 2 shows IR imaging device 100 of FIG. 1 with the full tessellation of subgratings $g_{i,j}$ that make up phase grating layer 105.

FIG. 2 shows IR imaging device 100 of FIG. 1 with the full tessellation of subgratings $g_{i,j}$ that make up phase grating layer 105. The boundaries between subgratings $g_{i,j}$ are contiguous across tessellation borders, so the borders are not easily visible. Individual subgratings are nevertheless readily identifiable with reference to their Cartesian coordinates expressed along the X axis as gx[3:0] and along the Y axis as gy[3:0]. For example, subgrating $g_{3,3}$ in the upper right corner is located in the intersection of column gx3 and row gy3. Pixels $p_{i,j}$ are likewise identifiable along the X axis as px[8:0] and along the Y axis as py[10:0].

Figure 3:
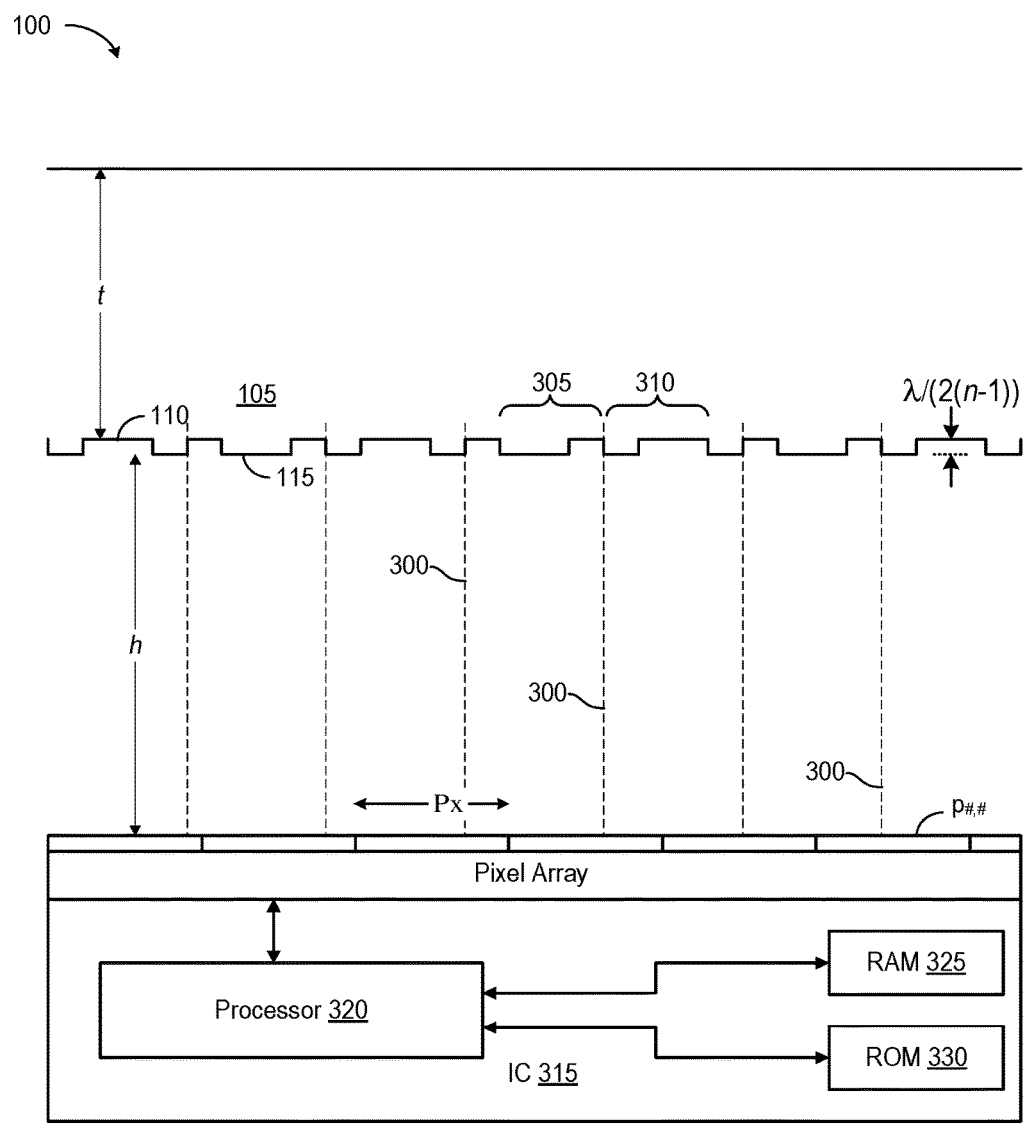
FIG. 3 is a cut-away view of imaging device 100 of FIGS. 1 and 2.

FIG. 3 is a cut-away view of imaging device 100 of FIGS. 1 and 2. Grating layer 105 is a binary, odd-symmetry silicon phase grating of thickness t separated from the array of pixels $p_{i,j}$ by an air interface of height h equal to 300 µm. Silicon is a relatively inexpensive material that has high IR transmission, and it can be patterned using well-known semiconductor processes. Other materials are suitable, however, and can be selected for different wavelengths or for other material or cost considerations. Thickness t and height h are 500 µm and 300 µm, respectively. Pixel pitch Px along the X dimension is about 100 µm; pixel pitch Py (FIG. 1) is similar. Any or all of these dimensions can vary in other embodiments.

Adjacent features 110 and 115 form six illustrative odds-symmetry boundaries 300, each indicated using a vertical, dashed line. The lower features 115 induce phase retardations of half a wavelength (π radians) relative to upper features 110. Features 305 and 310 on either side of each boundary exhibit odd symmetry. With this arrangement, paired features induce respective phase delays that differ by approximately half a wavelength λ over the wavelength band of interest, approximately 5 µm (half of 10 µm) in this example for imaging within the IR spectrum. The different phase delays produce curtains of destructive interference separated by relatively bright foci to produce an interference pattern on pixel array 107. Features 305 and 310 are of uniform width in this simple illustration, but vary across each subgrating $g_{i,j}$ and collection of subgratings. Curved and divergent boundaries of odd symmetry, as illustrated in FIG. 2, provide rich patterns of spatial modulations that can be processed to extract photos and other image information from a scene. Imaging device 100 includes an integrated circuit (IC) device 315 that supports image acquisition and processing. All the components of device 100 can be integrated into the same device or package using microfabrication techniques well known to those of skill in the art.

IC 315 includes a processor 320, random-access memory (RAM) 325, and read-only memory (ROM) 330. ROM 330 can store a digital representation of the point-spread function (PSF) of grating layer 105 from which a noise-dependent deconvolution kernel may be computed. ROM 330 can also store the deconvolution along with other parameters or lookup tables in support of image processing. Processor 320 captures digital image data from the pixel array and uses that data with the stored PSF to compute e.g. images and other image data. Processor 320 uses RAM 325 to read and write data in support of image processing. Processor 320 may support specialized processing elements that aid fast, power-efficient Fourier-or spatial-domain deconvolution, for example.

Figure 4:
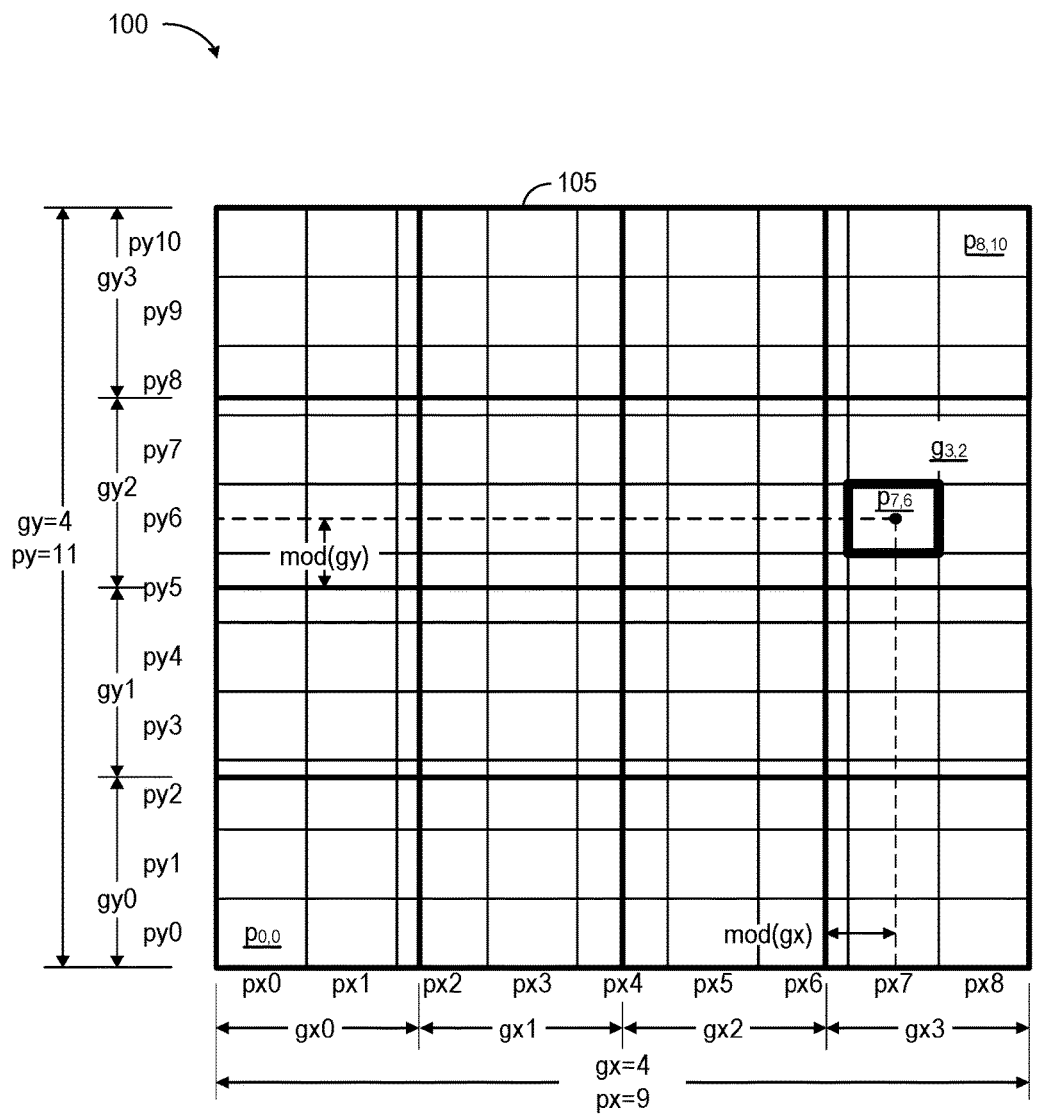
FIG. 4 depicts imaging device 100 with the details of subgratings $g_{i,j}$ obscured for ease of illustration.

FIG. 4 depicts imaging device 100 with the details of subgratings $g_{i,j}$ obscured for ease of illustration. The boundaries of subgratings $g_{i,j}$ are highlighted using lines that are bold relative to those of the underlying array of pixels $p_{i,j}$. A single pixel $p_{7,6}$ is also highlighted using a bold border. A dot in the center of pixel $p_{7,6}$ serves as a reference for pixel position relative to the subgrating array, and need not correspond to any physical structure. A point elsewhere on each pixel—e.g. a corner—could serve as a similar reference.

The center of pixel $p_{7,6}$, with reference to the array of subgratings, is located at gx3+mod(px7,gx) in the X dimension and gy2+mod(py6,gy) in the Y dimension. The displacements mod(px7,gx) and mod(py6,gy) place the center of pixel $p_{7,6}$ within overlaying subgrating $g_{3,2}$. The combination of mod(px7,gx) and mod(py6,gy) for pixel $p_{7,6}$ is unique among pixels $p_{i,j}$ with reference to their corresponding subgratings. The same is true of the remaining pixels. That is, no two pixels $p_{i,j}$ are located at the same position relative to their respective subgrating. Moreover, the modulo coordinates are evenly spaced along the X and Y axes.

Figure 5:
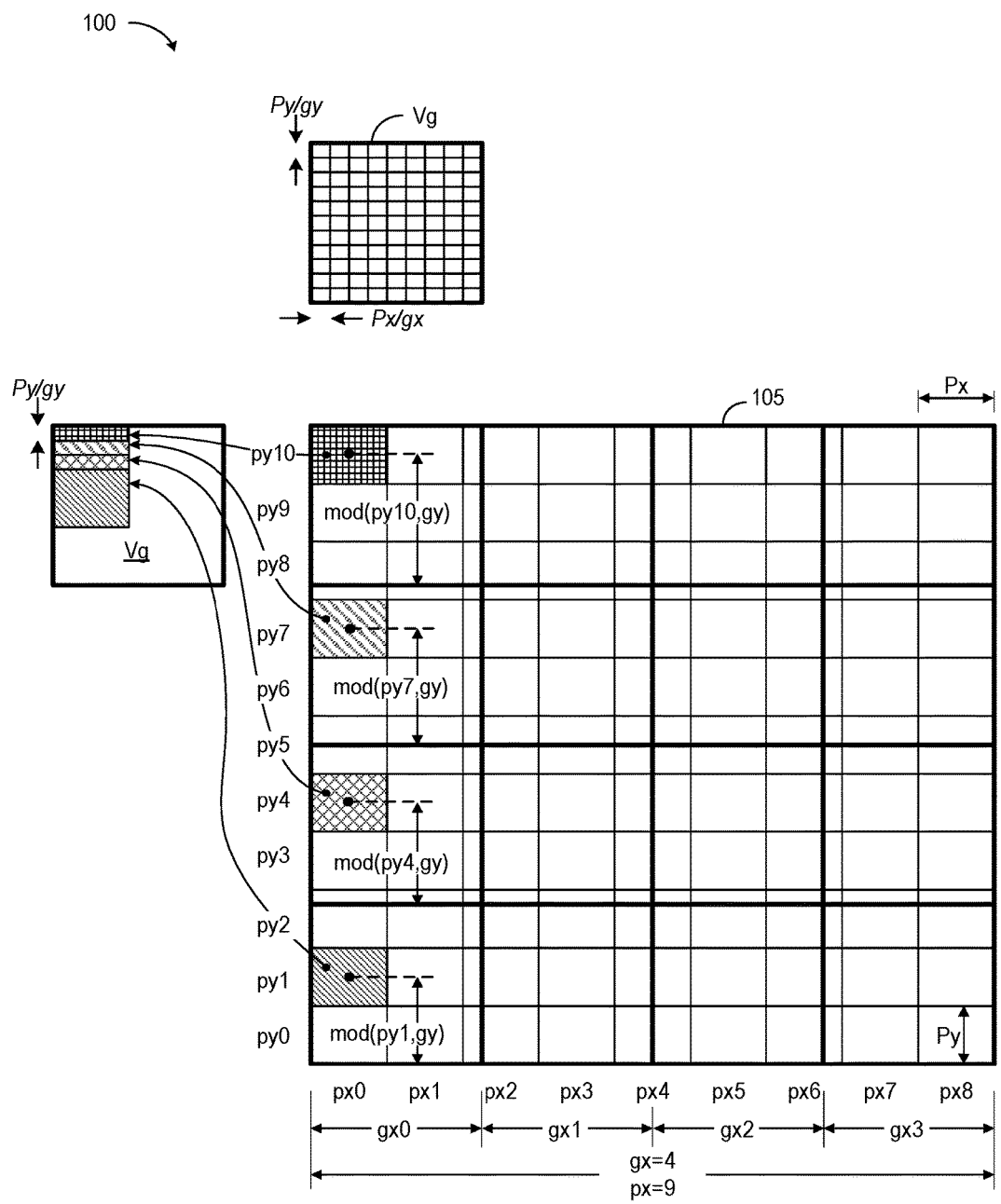
FIG. 5 depicts imaging device 100, again with the details of subgratings $g_{i,j}$ obscured for ease of illustration, with certain pixels shaded to illustrate their respective contributions.

FIG. 5 depicts imaging device 100, again with the details of subgratings $g_{i,j}$ obscured for ease of illustration, with certain pixels shaded to illustrate their respective contributions. Each physical pixel $p_{i,j}$ maps to a virtual location, similarly shaded, beneath a virtual archetypical subgrating Vg (at left). In the Y dimension, each of the four highlighted pixels is located a respective modulo gy from the lower boundary of its corresponding subgrating. These modulo are separated from one another by an offset Py/gy, which provides a virtual pixel size of the same extent. Though not shown, similar offsets for pixels along the X dimension provide a virtual pixel size of Px/gx. Pixels $p_{i,j}$ are thus distributed evenly in both the X and Y dimensions relative to the row and column intersections of the subgrating gird. The combination of the arrays of subgratings $g_{i,j}$ and pixels $p_{i,j}$ can thus be modeled as a single virtual subgrating Vg (top) with the same number of virtual pixels as there are pixels $p_{i,j}$. Imaging device 100 thus provides px times py independent measurements of the interference pattern from an archetypical subgrating.

The number of unique modulo coordinates preserves the resolution provided by the pixel array. The even spacings of the modulo coordinates in the X and Y dimensions simplifies the mathematics required to extract image information using e.g. Fourier deconvolution, and thus limits the time and processing power required for image processing.

Due to the finite size of each pixel, there will be some spatial frequencies whose period in either of the X or Y dimensions fits an integral number of times into the pixel extent in that dimension, and thus may not be observed by device 100. Such frequencies can be in the null space for imaging tasks. However, the precise spatial frequencies causing such nulls may not be part of the discrete Fourier basis of frequencies describing a finite-sized sensor array. In other words, while the frequency response of the pixels incurs a sinc penalty from the square-wave profile of the pixels, this sinc (which has zeros) will not in general be sampled at its zeros if the total lateral dimensions of the array are not integer multiples of the extent of the pixel. In imaging device 100, for example, there is no spatial frequency in the discrete-Fourier-transform basis that cannot be sampled, so the system has full rank, and, with a sufficiently high signal-to-noise ratio (SNR), can produce images with as many free parameters as there are pixels.

Figure 6A:
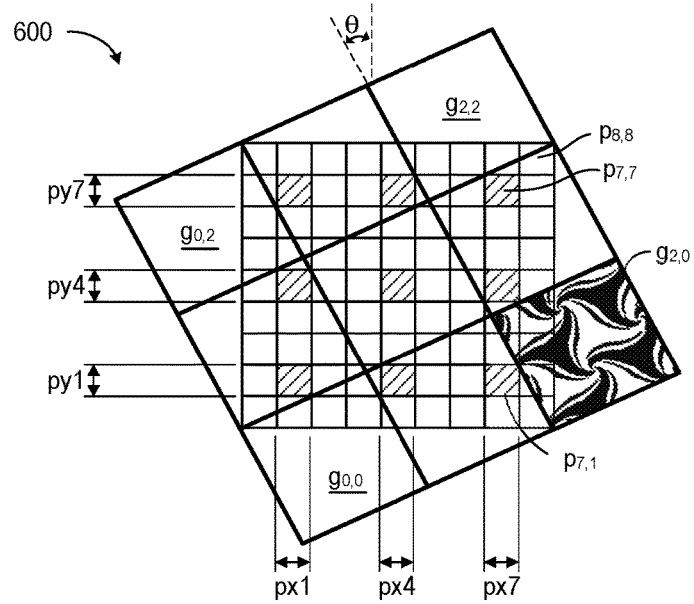
FIG. 6A depicts an imaging device 600 in accordance with another embodiment. An nine-by-nine array of pixels $p_{i,j}$ underlies a nine-by-nine array of subgratings $g_{i,j}$.

FIG. 6A depicts an imaging device 600 in accordance with another embodiment. A nine-by-nine array of pixels $p_{i,j}$ underlies a three-by-three array of subgratings $g_{i,j}$. The patterns of all but one subgrating $g_{2,0}$ are omitted so as not to obscure the underlying pixel locations. Nine pixels are shaded to illustrate their positions relative to the overlying subgratings. The columns of subgratings $g_{i,j}$ are offset from the columns of pixels $p_{i,j}$ by an angle θ, the arctangent of which is one half in this example. This angle and the size of the subgratings are selected to map the physical pixels to unique virtual locations with respect to an archetypal subgrating. In this example, each of the shaded pixels maps to a unique virtual location with respect to its overlying subgrating.

Figure 6B:
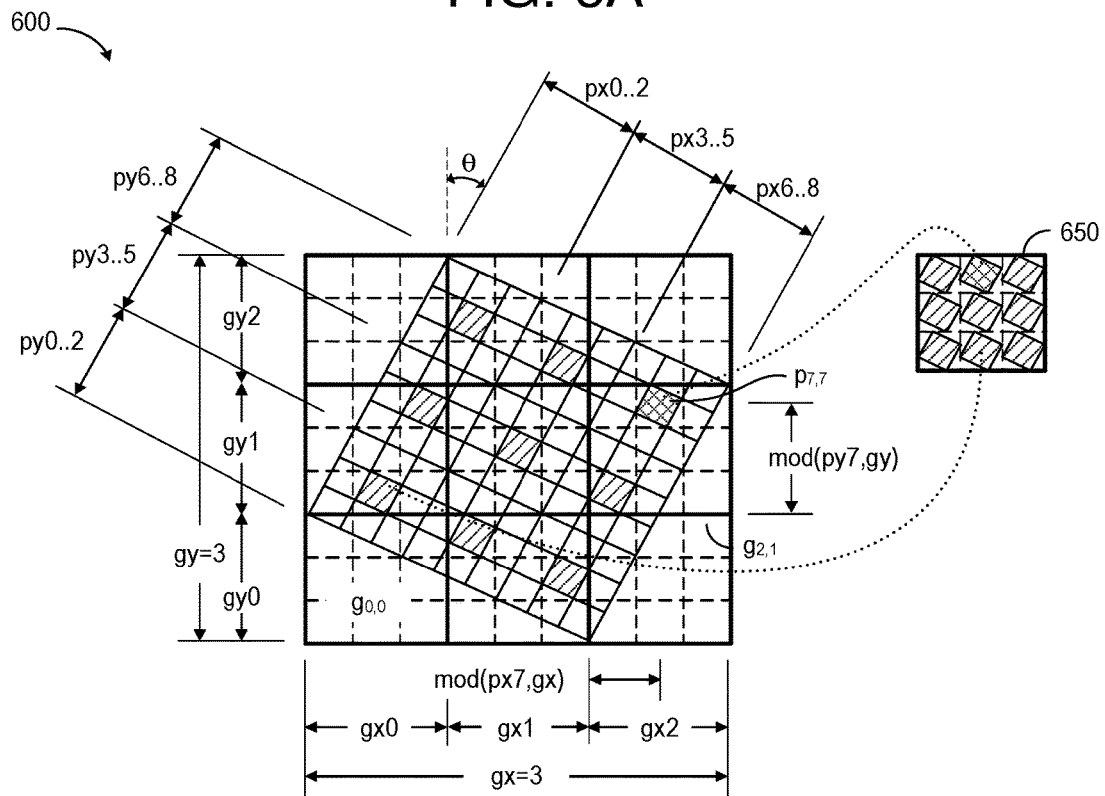
FIG. 6B depicts imaging device 600 rotated by angle $\theta$. Each subgrating $g_{i,j}$ is divided into nine equal regions using dashed lines.

FIG. 6B depicts imaging device 600 rotated by angle θ. Each subgrating $g_{i,j}$ is divided into nine equal regions using dashed lines. The nine subgratings $g_{i,j}$ collectively cover all eighty-one pixels, and the center of each shaded pixel underlies a unique region within a corresponding subgrating. For example, taking the lower left corner of device 600 as gx0/gy0, the center of pixel $p_{7,7}$ is located at gx2+mod(px7, gx) in the X dimension and gy1+mod(py7,gy) in the Y dimension. As in prior examples, the X and Y dimensions refer to the Cartesian coordinate system defined by the array of subgratings. The values px7 and py7 can be expressed as trigonometric functions of pixel pitches px and py and angle θ.

The displacements mod(px7,gx) and mod(py7,gy) place the center of pixel $p_{7,7}$ within overlaying subgrating $g_{2,1}$. The combination of mod(px7,gx) and mod(py7,gy) for pixel $p_{7,7}$ is unique among pixels $p_{i,j}$ with reference to their corresponding subgratings, and the same is true of the remaining pixels. The centers of the shaded pixels are evenly spaced along the X and Y axes. The combination of the array of subgratings $g_{i,j}$ and the shaded pixels $p_{i,j}$ can thus be modeled as a single virtual subgrating 650 with three rows and three columns of evenly spaced virtual pixels.

Figure 6C:
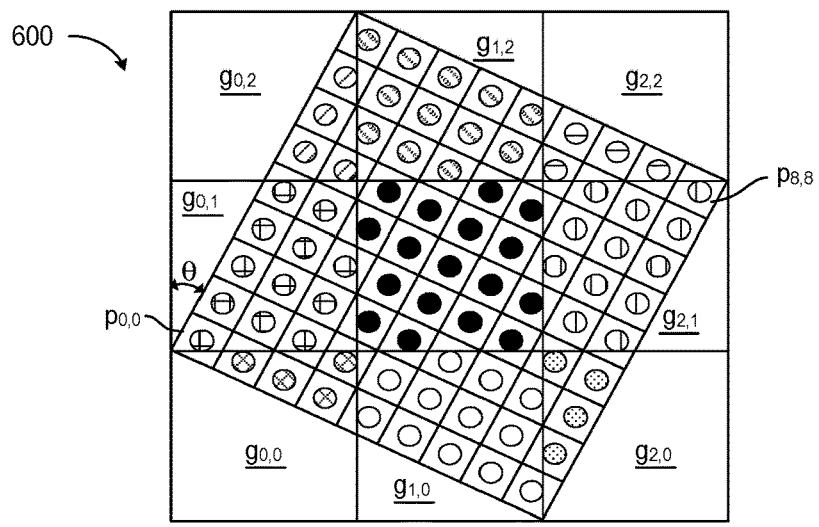
FIG. 6C depicts imaging device 600 with the array of pixels $p_{i,j}$ oriented at angle $\theta$ relative to the array of subgratings $g_{i,j}$ as in the example of FIG. 6B.

FIG. 6C depicts imaging device 600 with the array of pixels $p_{i,j}$ oriented at angle θ relative to the array of subgratings $g_{i,j}$ as in the example of FIG. 6B. Pixels $p_{i,j}$ are square and have a pitch Pp; subgratings $g_{i,j}$ are also square, and have a pitch $$Pg = \frac{9}{\sqrt{5}}(Pp);$$

and the angle $$\theta = \tan^{-1}\frac{1}{2}.$$

The center of each pixel is marked with a small circle, each shaded or filled to identify them as members of groups of pixels associated with corresponding subgratings. For example, pixel $p_{0,0}$ is shaded like the other pixels beneath subgrating $g_{0,1}$.

Figure 6D:
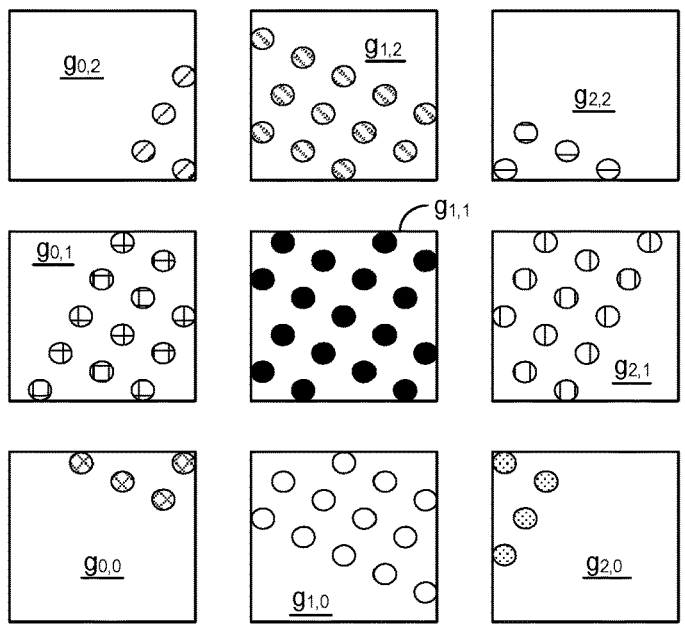
FIG. 6D depicts imaging device 600 with the nine subgratings $g_{i,j}$ separated and the pixel outlines omitted to highlight the constellations of pixel centers for each subgrating.

FIG. 6D depicts imaging device 600 with the nine subgratings $g_{i,j}$ separated and the pixel outlines omitted to highlight the constellations of pixel centers for each subgrating. Because the location of each pixel center relative to its overlying subgrating is unique among the pixels, device 600 provides the same number of interdependent measurements as there are pixels in the array.

Figure 6E:
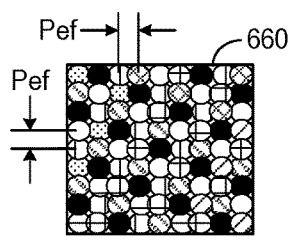
FIG. 6E depicts an archetypal subgrating 660 encompassing all the constellations of pixel centers from the nine subgratings $g_{i,j}$ of e.g.

FIG. 6E depicts an archetypal subgrating 660 encompassing all the constellations of pixel centers from the nine subgratings $g_{i,j}$ of e.g. FIGS. 6C and 6D. The constellations combine such that the center of each pixel $p_{i,j}$ occupies one of eighty-one unique locations arranged in nine rows and nine columns relative to the archetypal subgrating. The rows and columns are spaced by an effective pixel pitch Pef that is one-ninth grid pitch Pg. The even spacings of the modulo coordinates of pixels $p_{i,j}$ relative to the subgrating array facilitates Fourier deconvolution for image recovery and analysis.

Figure 7A:
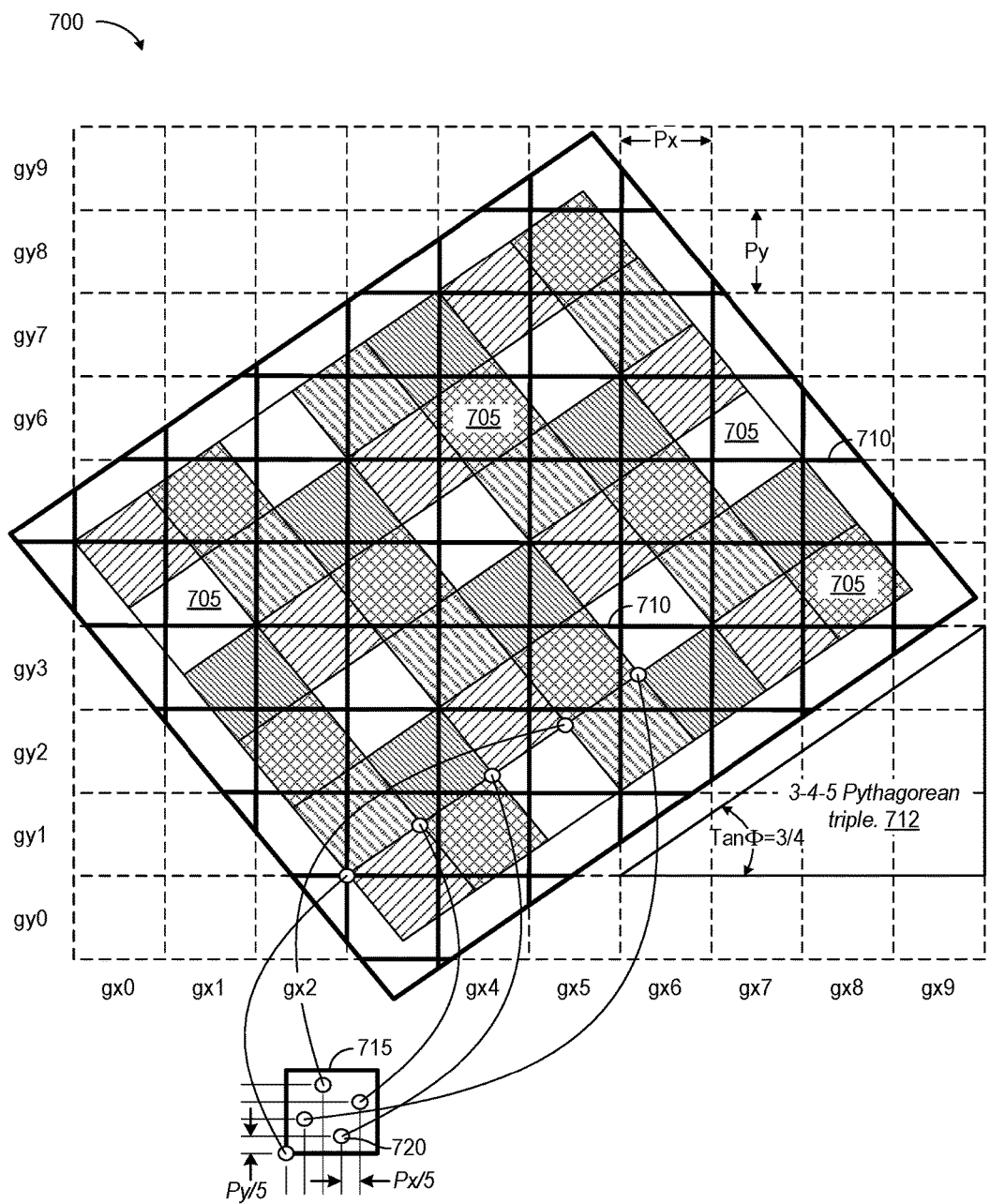
FIG. 7A depicts an imaging device 700 in accordance with another embodiment.

FIG. 7A depicts an imaging device 700 in accordance with another embodiment. A seven-by-six array of pixels 705 of pitch Px in the X dimension and pitch Py in the Y dimension is disposed beneath an array of subgratings 710. Subgratings 710 are of the same size and aspect ratio as pixels 705, but the array of subgratings is offset by an angle Φ, the tangent of which is ¾ in this example. This relative orientation is represented using as a 3-4-5 triangle 712, a Pythagorean triple. This arrangement produces five classes of subgrating/pixel alignment, with each class representing a specific relative alignment and placement of a pixel vis-a-vis the overlying subgrating. Pixels 705 that are members of the same class are highlighted using the same manner of shading. The topographical features of subgratings 710 are omitted here to show the relative placement and orientation of pixels 705.

The five leftmost pixels 705 in the lowermost row include a member from each class. The leftmost corner of each of these pixels is marked with a circle to provide a reference point relative to the respective overlaying subgrating 710. Each of these reference points is mapped to an archetypal subgrating 715, with the resulting constellation of circles 720 representing the positional diversity of each class of pixel relative to its respective and identical subgratings. The five circles 720 are distributed evenly in both the X and Y dimensions relative to the row and column intersections of the subgrating gird. The incremental spacing in the X dimension is Px/5, where Px is the pixel and subgrating pitch in the X dimension; the incremental spacing in the Y dimension is Py/5, where Py is the pixel and subgrating pitch in the Y dimension. In this particular arrangement, each pixel 705 in the array remaps to one of these five locations. The array of subgratings $g_{i,j}$ and pixels $p_{i,j}$ can thus be modeled as a single virtual subgrating 715 with five virtual pixels evenly spaced in the X and Y dimensions. Imaging device 700 thus provides five-times oversampling.

Figure 7B:
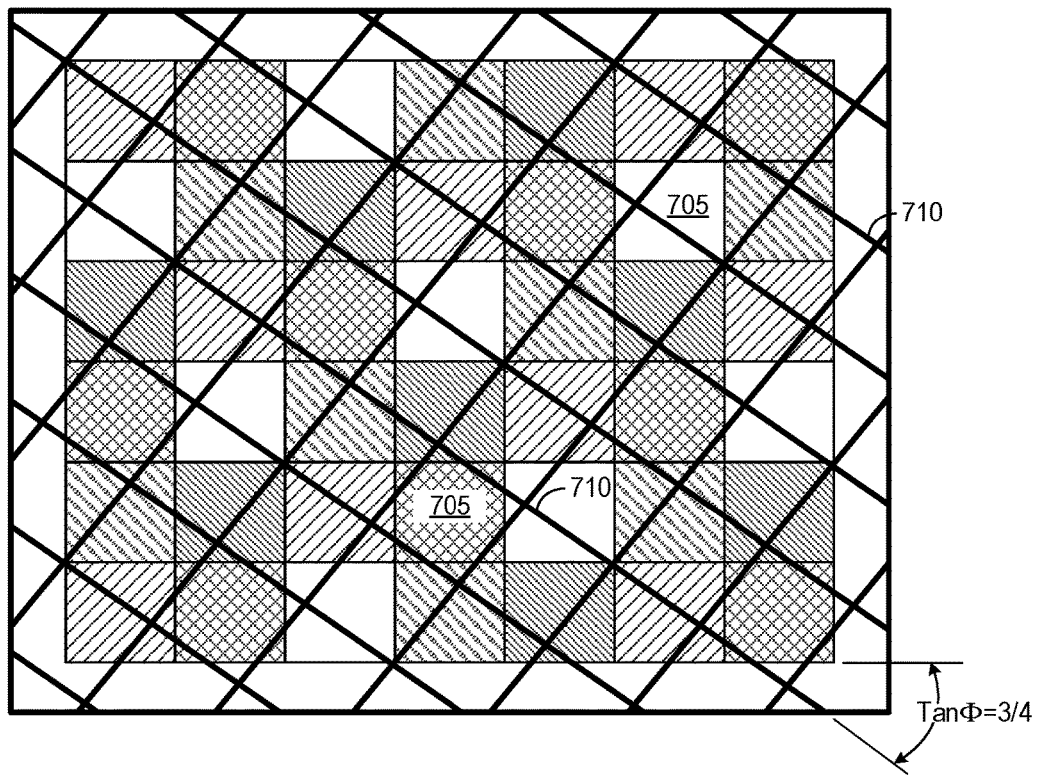
FIG. 7B depicts imaging device 700 of FIG. 7A reoriented such that the rows and columns of pixels 705 are horizontal and vertical in the view.

FIG. 7B depicts imaging device 700 of FIG. 7A reoriented such that the rows and columns of pixels 705 are horizontal and vertical in the view, as would be expected—though not necessary—for a camera of this type.

Figure 8:
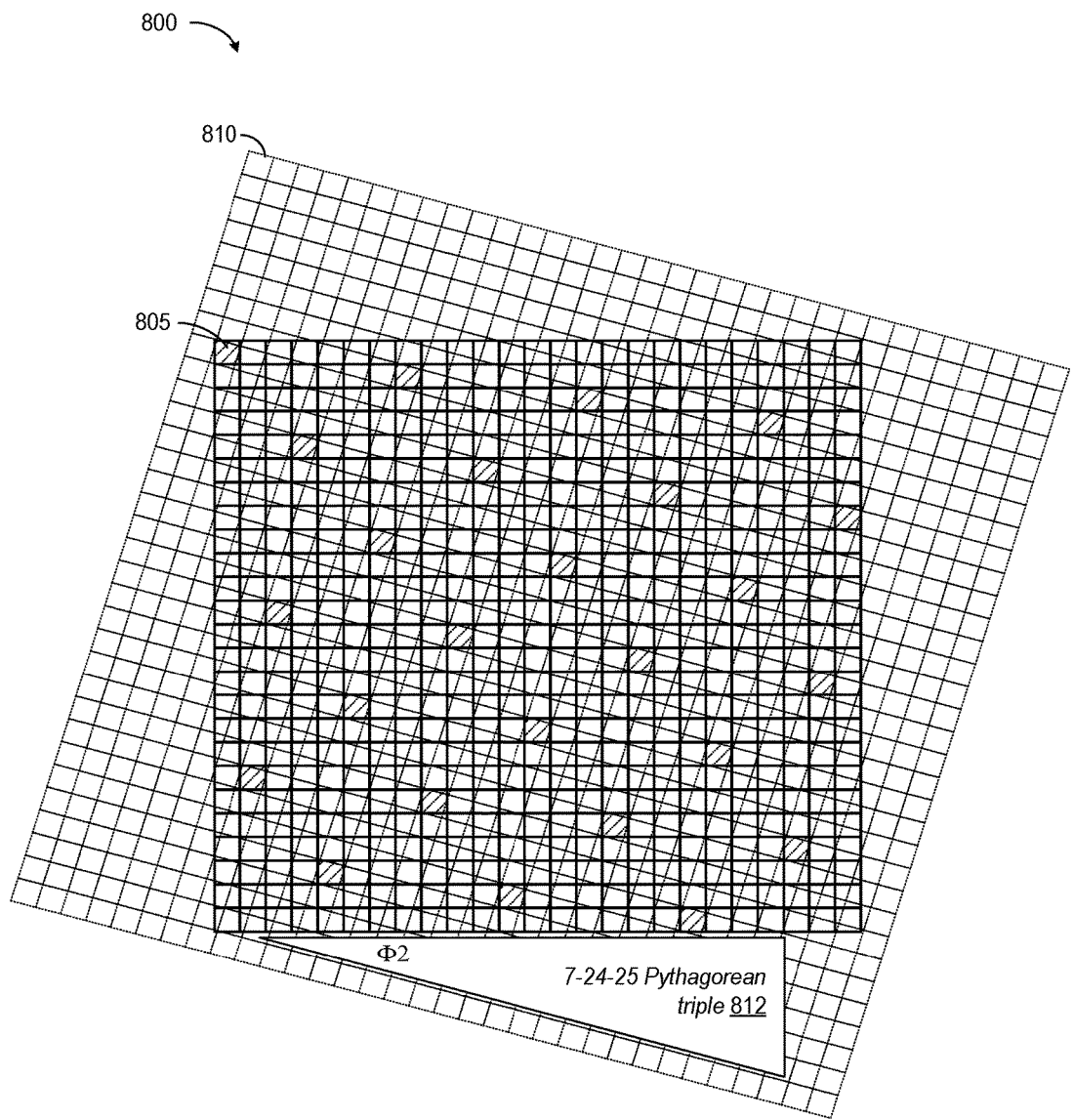
FIG. 8 depicts an imaging device 800 in accordance with another embodiment.

FIG. 8 depicts an imaging device 800 in accordance with another embodiment. A 25×25 array of pixels 805 is disposed beneath an array of identically sized subgratings 810 offset by an angle Φ2, the tangent of which is 7/24. This relative orientation is represented using as a 7-24-25 triangle 812, another Pythagorean triple. This arrangement produces twenty-five classes of subgrating/pixel alignment. Pixels 805 that are members of one of those classes are highlighted by shading. The location of each pixel 805 maps to one of twenty-five locations within an archetypal subgrating. As in prior examples, these locations are spaced evenly in the X and Y dimensions of the subgrating array. The incremental spacing in the X dimension is Px/25 and in the Y dimension Py/25, where Px and Py are the pitches of the pixel array. The array of subgratings 810 and pixels 805 can be modeled as a single virtual subgrating with twenty-five virtual pixels evenly spaced in the X and Y dimensions. Imaging device 800 thus provides twenty-five-times oversampling and reduced noise and increased resolution relative to the pixel array.

Figure 9:
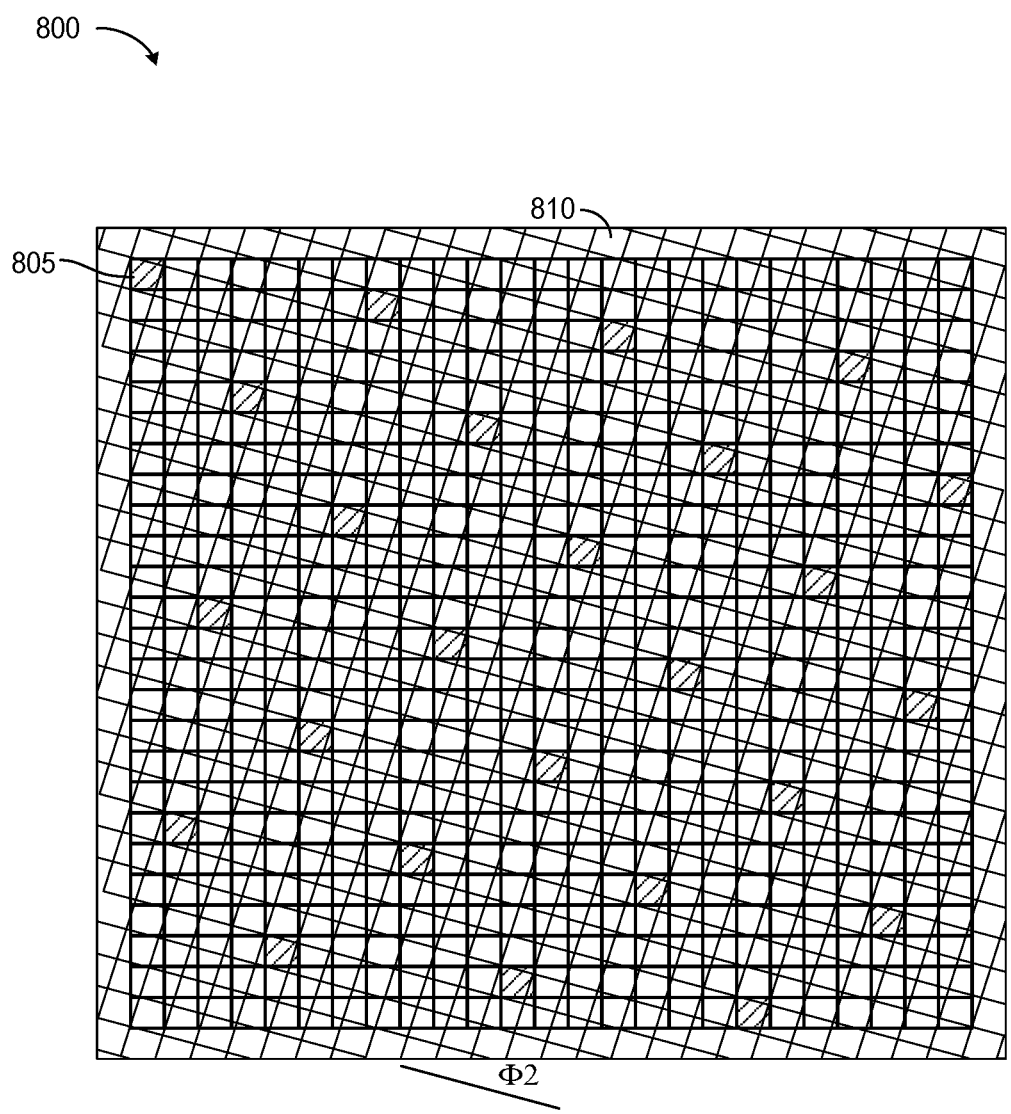
FIG. 9 depicts imaging device 800 of FIG. 8 with subgratings 810 trimmed around the perimeter.

FIG. 9 depicts imaging device 800 of FIG. 8 with subgratings 810 trimmed around the perimeter. The subgratings extend beyond the boundaries of the pixel array so that the foci and curtains produced by subgratings 810 are continuous over the angles of incident light.

Figure 10A:
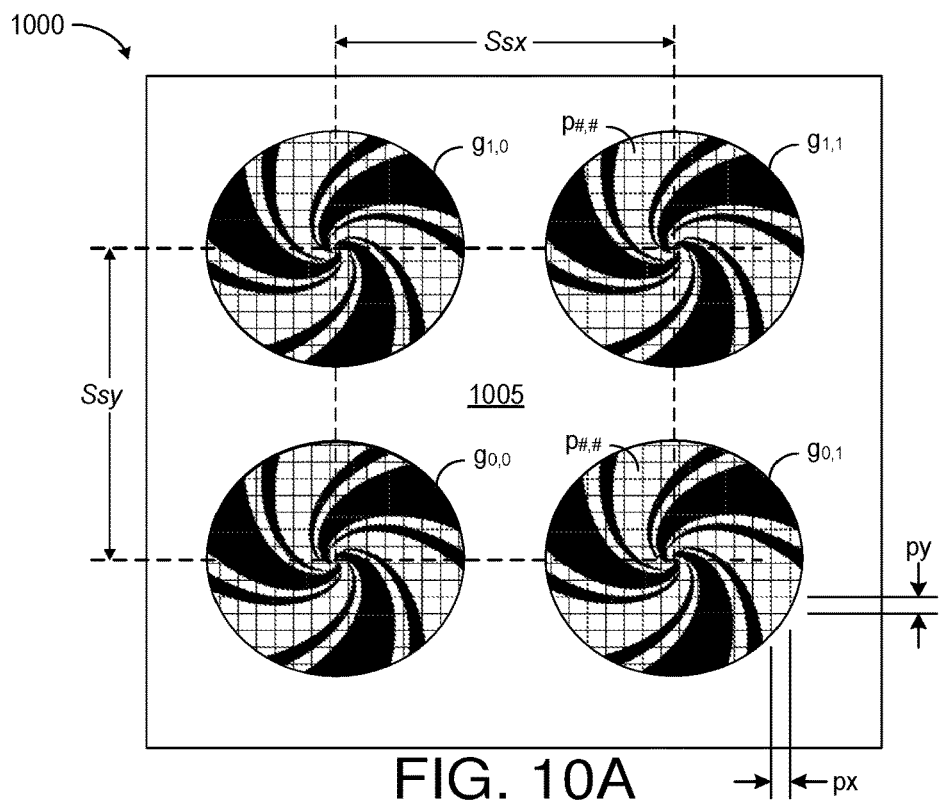
FIG. 10A depicts a visible-light imaging device 1000 in accordance with another embodiment.

FIG. 10A depicts a visible-light imaging device 1000 in accordance with another embodiment. Device 1000 includes an phase grating layer with an array of four subgratings $g_{i,j}$ disposed over an array of pixels $p_{i,j}$. Subgratings $g_{i,j}$ are separated by an aperture layer 1005 that is opaque to incoming light. As in prior examples, the surface of subgratings $g_{i,j}$ includes transparent features, shown in black and white, that define between them boundaries of odd symmetry. The features shown in black are raised in the Z dimension (normal to the view) relative to the features shown in white, and the boundaries between the features produce interference patterns on the underlying pixel array.

Subgratings $g_{i,j}$ are identical, and each casts essentially the same interference pattern on the underlying pixel array. The identical patterns are not sampled identically, however, as each subgrating is offset by a different amount relative to the Cartesian coordinates defined by the underlying pixels. In this example, grating columns $g_{i,0}$ and $g_{i,1}$ are separated by a spacing Ssx of eighteen and one-half times the pixel pitch px in the X dimension, and grating rows $g_{0,j}$, and $g_{1,j}$ are separated by a spacing Ssy of eighteen and one-half times the pixel pitch py in the Y dimension. In other embodiments, not every subgrating will have a unique alignment with the pixel array; multiple subgratings can still be useful for improving the signal to noise ratio and for lightfield sampling used for e.g. depth estimation.

Figure 10B:
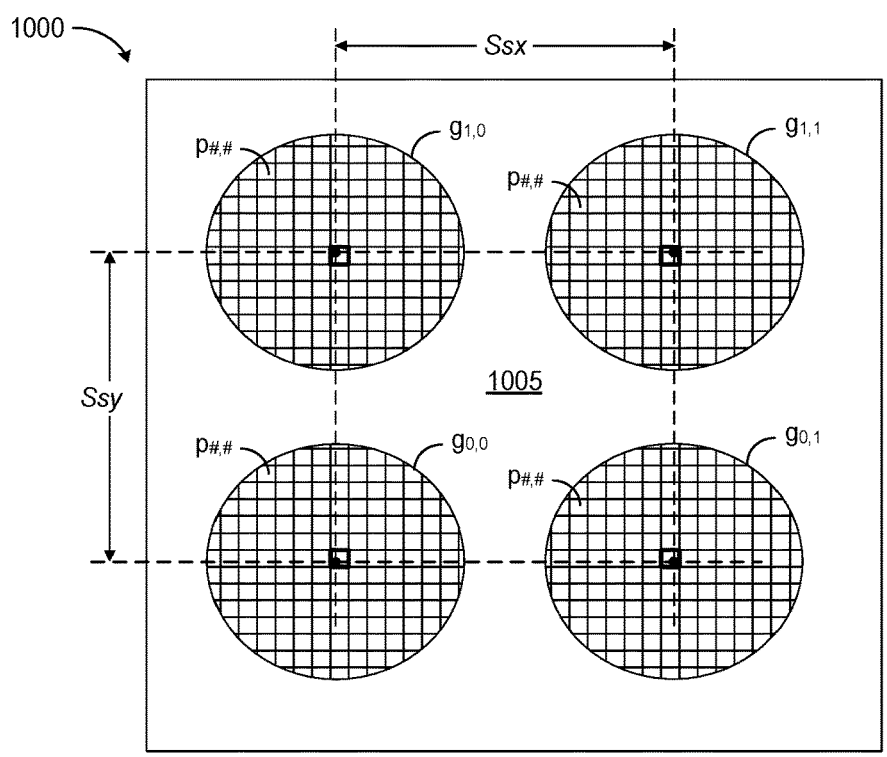
FIG. 10B depicts imaging device 1000 of FIG. 10A with the grating features omitted to more clearly show pixels $p_{i,j}$.

FIG. 10B depicts imaging device 1000 of FIG. 10A with the grating features omitted to more clearly show pixels $p_{i,j}$. The center of each subgrating $g_{\#,\#}$ is marked with a dot to show the locations of the subgratings relative to an underlying pixel that is highlighted by a bold border. The centers of the subgratings are disposed over separate locations of the highlighted pixels. Other corresponding grating locations are likewise distributed with respect to underlying pixels. Each captured interference pattern thus provides a unique set of data responsive to an imaged scene. The effective resolution is thus increased relative to pixel pitches px and py.

Pixel pitches px and py are relatively large in this example for ease of illustration. Pitches px and py are no bigger than about one-third the widest dimension of one of the spiral arms formed by the features of subgratings $g_{\#,\#}$, and can be much smaller. In one embodiment, for example, the pixel array of FIGS. 10A and 10B is 160×160 pixels.

While the subject matter has been described in connection with specific embodiments, other embodiments are also envisioned. For example, the wavelength band of interest can be broader or narrower than those of the foregoing examples, and may be discontinuous. A linear array of pixels can be used alone or in combination with other linear arrays to sense one-dimensional aspects of a scene from one or more orientations. Moreover, if a given subgrating exhibits some Fourier nulls, then two or more general regions that potentially have different aspect ratios, grating designs or orientations, or any combination of the above, could provide independent measurements of the scene. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. An imaging device comprising:
   an optical phase grating layer including a repeating pattern of subgratings, with a first subgrating number gx of the subgratings along a first axis X and a second subgrating number gy of the subgratings along a second axis Y; and
   a pixel array having pixels, including:
      a first pixel number px of the pixels along the first axis X, the first pixel number px coprime with the first subgrating number gx in that the first pixel number px and the first subgrating number gx share no common integer factor other than one; and
      second pixel number py of the pixels along the second axis Y, the second pixel number py coprime with the second subgrating number gy in that the second pixel number py and the second subgrating number gy share no common integer factor other than one.

2. The imaging device of claim 1, wherein the repeating pattern of the subgratings comprises rows and columns of the subgratings.

3. The imaging device of claim 2, wherein the pixel array comprises rows and columns of the pixels.

4. The imaging device of claim 3, wherein the columns of the subgratings extend at an angle with respect to the columns of the pixels.

5. The imaging device of claim 4, wherein the angle is of a Pythagorean triple.

6. The imaging device of claim 1, wherein the subgratings are identical.

7. The imaging device of claim 1, the phase grating to cast an interference pattern on the pixel array, each subgrating including boundaries of odd symmetry separating stepped features on opposite sides of each boundary, the stepped features on the opposite sides of each boundary offset from the pixel array to induce a phase difference of half of a wavelength within the infrared spectrum, plus an integer multiple of the wavelength, to produce curtains of destructive interference at the pixel array.

8. The imaging device of claim 1, further comprising superfluous pixels.

9. The imaging device of claim 8, wherein the superfluous pixels comprise defective pixels.

10. The imaging device of claim 1, wherein each of the pixels is located beneath a respective subgrating at a location relative to the respective subgrating, the pixel array further comprising redundant pixels at the locations relative to others of the subgratings.

\* \* \* \* \*